(12) United States Patent
Moriya et al.

(10) Patent No.: US 7,824,642 B2
(45) Date of Patent: Nov. 2, 2010

(54) METHOD FOR PRODUCING FORSTERITE POWDER, FORSTERITE POWDER, SINTERED FORSTERITE, INSULATING CERAMIC COMPOSITION, AND MULTILAYER CERAMIC ELECTRONIC COMPONENT

(75) Inventors: Yoichi Moriya, Omihachiman (JP); Naoya Mori, Omihachiman (JP)

(73) Assignee: Murata Manufacturing Co., Ltd., Nagaokakyo-shi, Kyoto-fu (JP)

(*) Notice: Subject to any disclaimer, the term of this patent is extended or adjusted under 35 U.S.C. 154(b) by 0 days.

(21) Appl. No.: 12/719,158

(22) Filed: Mar. 8, 2010

(65) Prior Publication Data

US 2010/0170705 A1    Jul. 8, 2010

Related U.S. Application Data

(60) Division of application No. 12/141,586, filed on Jun. 18, 2008, now Pat. No. 7,704,477, which is a continuation of application No. PCT/JP2006/323848, filed on Nov. 29, 2006.

(30) Foreign Application Priority Data

Dec. 27, 2005   (JP)   ............................. 2005-376195

(51) Int. Cl.
   *C01B 33/24*   (2006.01)
   *C01F 5/00*    (2006.01)
(52) U.S. Cl. ................... 423/331; 423/635; 501/135; 174/255
(58) Field of Classification Search ............. 423/331, 423/635; 501/135, 122, 136; 174/255
See application file for complete search history.

(56) References Cited

U.S. PATENT DOCUMENTS

| 5,079,194 | A  | 1/1992  | Jean et al.    |
|-----------|----|---------|----------------|
| 6,366,564 | B1 | 4/2002  | Hiraka et al.  |
| 6,458,734 | B1 | 10/2002 | Sugimoto et al.|
| 6,602,623 | B1 | 8/2003  | Mizutani et al.|
| 6,878,464 | B2 | 4/2005  | Moriya et al.  |
| 2005/0095464 | A1 | 5/2005 | Lee et al.    |
| 2006/0275686 | A1 | 12/2006 | Kadota et al. |

FOREIGN PATENT DOCUMENTS

| EP | 1095915    | 5/2001  |
| JP | 11228222   | 8/1999  |
| JP | 11310455   | 11/1999 |
| JP | 2001080959 | 3/2001  |
| JP | 2002097072 | 4/2002  |
| JP | 2003002640 | 1/2003  |
| JP | 2003327470 | 11/2003 |
| JP | 2005335986 | 12/2005 |

OTHER PUBLICATIONS

Mamoru Senna; "Incipient chemical interaction between fine particles under mechanical stress—a feasibility of producing advanced materials via mechanochemical routes"; Solid State Ionics, 63-65, (1993) 3-9.

*Primary Examiner*—Jerry Lorengo
*Assistant Examiner*—Rebecca Lee
(74) *Attorney, Agent, or Firm*—Dickstein Shapiro LLP

(57) ABSTRACT

A forsterite powder with superior characteristics which can be sintered at a relatively low temperature can be economically produced, when a magnesium source, a silicon source, and copper particles are mixed to prepare a mixed powder containing 300 to 2,000 ppm by weight of the copper particles, and the mixed powder is fired. The magnesium source used is preferably $Mg(OH)_2$, and the silicon source used is preferably $SiO_2$. A polycrystalline forsterite powder is preferably produced. The magnesium source, the silicon source, and the copper particles can be mixed in the presence of a solvent to prepare the mixed powder. The forsterite powder preferably contains 300 to 2,000 ppm by weight of copper, has a particle size of 0.20 to 0.40 µm and has a crystal size of 0.034 to 0.040 µm.

12 Claims, 7 Drawing Sheets

METHOD FOR PRODUCING FORSTERITE POWDER, FORSTERITE POWDER, SINTERED FORSTERITE, INSULATING CERAMIC COMPOSITION, AND MULTILAYER CERAMIC ELECTRONIC COMPONENT

This is a division of application Ser. No. 12/141,586, filed May 18, 2008, which was a continuation of application Serial No. PCT/JP2006/323848, filed Nov. 29, 2006.

TECHNICAL FIELD

The present invention relates to a method for producing a forsterite powder by mixing and firing a magnesium source such as $Mg(OH)_2$ powder, a silicon source such as $SiO_2$ powder, and copper particles, and also relates to a forsterite powder, sintered forsterite, a forsterite-based insulating ceramic composition, and a multilayer ceramic electronic component produced using a forsterite-based ceramic material.

BACKGROUND ART

Forsterite, a material used for production of ceramic electronic components, is usually produced by mixing and pulverizing $Mg(OH)_2$ powder and $SiO_2$ powder and firing the mixture so that the $Mg(OH)_2$ and $SiO_2$ react with each other.

One method for producing a forsterite powder has been proposed in Patent Document 1. In this method, forsterite (a magnesium-containing oxide powder) is produced by forming liquid microparticles of a solution containing magnesium and silicon and firing the microparticles in the suspended state in an oxygen-containing gas.

A firing (calcining) step is essential for the production of the forsterite powder. With the technique of Patent Document 1, a forsterite powder can be economically produced at a relatively low firing temperature by firing the liquid microparticles in a suspended state.

The above technique, however, has the problem of increased equipment costs because it requires special equipment, such as an ultrasonic atomizer, for firing the liquid microparticles in a suspended state and powder separation equipment, such as a cyclone separator, for separating the resultant forsterite particles.

A common method in which a mixture of $Mg(OH)_2$ and $SiO_2$ is allowed to react by firing rather than using the method of firing in a suspended state, as in Patent Document 1, has the problem of increased thermal energy costs for firing because the firing temperature must be raised to around 1,200° C. Another problem is that firing under high-temperature conditions approaching 1,200° C. causes the particles of forsterite powder to grow to an excessive particle size for use as a material for electronic components.

Patent Document 1: Japanese Unexamined Patent Application Publication No. 2003-002640

DISCLOSURE OF INVENTION

Problems to be Solved by the Invention

An object of the present invention, which has been made to solve the above problems, is to provide an economical method capable of producing a forsterite powder with superior characteristics at low firing temperature, a forsterite powder produced by the method, and sintered forsterite, an insulating ceramic composition, and a multilayer ceramic electronic component with superior characteristics produced using the forsterite powder.

Means for Solving the Problems

To solve the above problems, a method for producing a forsterite powder includes the steps of:
preparing a magnesium source, a silicon source, and copper particles;
mixing the magnesium source, the silicon source, and the copper particles to prepare a mixed powder containing 300 to 2,000 ppm by weight of the copper particles; and
firing the mixed powder.

Preferably, the magnesium source is $Mg(OH)_2$ and the silicon source is $SiO_2$ in the method for producing a forsterite powder.

The forsterite powder is a polycrystalline forsterite powder in the method for producing a forsterite powder.

The magnesium source, the silicon source, and the copper particles can be mixed in the presence of a solvent to prepare the mixed powder in the method for producing a forsterite powder.

A forsterite powder of the present application contains 300 to 2,000 ppm by weight of copper. The fired forsterite powder is a polycrystalline forsterite powder and the forsterite powder preferably contains 300 to 2,000 ppm by weight of copper at crystal grain boundaries.

A preferred forsterite powder of the invention has a particle size of 0.20 to 0.40 μm and/or a crystal size of 0.034 to 0.040 μm.

The sintered forsterite is produced by firing the forsterite powder described above.

An insulating ceramic composition of the present includes:
a first ceramic powder mainly including the forsterite powder;
a second ceramic powder formed of at least one material selected from the group consisting of a ceramic powder mainly containing calcium titanate, a ceramic powder mainly containing strontium titanate, and a ceramic powder mainly containing titanium oxide; and
a borosilicate glass powder;
wherein the borosilicate glass contains 3% to 15% by weight of lithium on a $Li_2O$ basis, 30% to 50% by weight of magnesium on a MgO basis, 15% to 30% by weight of boron on a $B_2O_3$ basis, 10% to 35% by weight of silicon on a $SiO_2$ basis, 6% to 20% by weight of zinc on a ZnO basis, and 0% to 15% by weight of aluminum on an $Al_2O_3$ basis.

A multilayer ceramic electronic component of the present invention includes laminated insulating ceramic layers and wiring conductors associated with the insulating ceramic layers, wherein
the insulating ceramic layers are formed of the insulating ceramic composition; and
the wiring conductors mainly contain copper or silver.

Advantages

The method of the present invention for producing a forsterite powder includes the steps of preparing the magnesium source, such as $Mg(OH)_2$ powder, the silicon source, such as $SiO_2$ powder, and the copper particles; mixing the magnesium source, the silicon source, and the copper particles to prepare a mixed powder containing 300 to 2,000 ppm by weight of the copper particles; and firing the mixed powder. The mixed powder can be fired at a low firing temperature, for example, about 1,100° C., to produce a fine forsterite powder that has a small particle size suitable for production of electronic components and that is comparable in characteristics to one produced by a conventional production method in which a mixed powder including $Mg(OH)_2$ powder and $SiO_2$ powder, but no copper particles, is fired at a high temperature around 1,200° C.

In the firing step, the copper particles facilitate a reaction between MgO, derived from the magnesium source, such as $Mg(OH)_2$, and $SiO_2$, derived from the silicon source. The reaction between MgO and $SiO_2$ can therefore be completed at a relatively low firing temperature and within a short firing time. This allows synthesis of a forsterite powder containing no residual MgO (unreacted component).

In addition, the low-temperature firing retards grain growth of the forsterite powder being synthesized, thus providing a fine forsterite powder with small particle size.

As a result, a forsterite powder with superior characteristics which has small particle size and which contains substantially no unreacted magnesium-based component can be economically produced at a relatively low firing temperature.

In the invention the amount of copper particles added falls within the range of 300 to 2,000 ppm by weight. If the amount of copper particles added falls below 300 ppm by weight, some unreacted MgO remains in the forsterite powder. If the amount of copper particles added exceeds 2,000 ppm by weight, the forsterite powder loses one of its features, namely, low dielectric loss.

If the magnesium source used is $Mg(OH)_2$ powder and the silicon source used is $SiO_2$ powder in the present invention, the molar ratio of $Mg(OH)_2$ to $SiO_2$, namely, $Mg(OH)_2/SiO_2$, preferably falls within the range of 1.95 to 2.05.

If $Mg(OH)_2/SiO_2$ falls below 1.95, reaction products other than forsterite are produced. This is undesirable because such reaction products decrease the amount of forsterite produced.

If $Mg(OH)_2/SiO_2$ exceeds 2.05, MgO remains. This is undesirable because the residual MgO causes problems such as increased hygroscopicity.

The $Mg(OH)_2$ powder used to prepare the mixed powder by mixing the $Mg(OH)_2$ powder, the $SiO_2$ powder, and the copper particles preferably has a particle size of 0.20 to 0.40 μm.

If the $Mg(OH)_2$ powder has a particle size of less than 0.20 μm, the forsterite powder can have a particle size of less than 0.20 μm. This is undesirable because such a forsterite powder has high hygroscopicity. If the $Mg(OH)_2$ powder has a particle size of more than 0.40 μm, the resultant forsterite powder can have a particle size of more than 0.40 μm. When a forsterite powder having a particle size of more than 0.40 μm is used to produce a ceramic substrate, the forsterite powder requires a large amount of glass to be added because it has poor sinterability. This is undesirable because the glass causes the problem of degrading of characteristics such as the Q factor (the reciprocal of the dielectric loss δ).

In the method of the present invention for producing a forsterite powder, the particle size of the $Mg(OH)_2$ powder largely affects that of the forsterite powder to be produced. To produce a forsterite powder with a desired particle size, therefore, the particle size of the $Mg(OH)_2$ powder must be appropriately controlled.

The $SiO_2$ powder used to prepare the mixed powder by mixing the $Mg(OH)_2$ powder, the $SiO_2$ powder, and the copper particles preferably has a particle size of 2.0 μm or less. If the $SiO_2$ powder has a particle size of more than 2.0 μm, pure forsterite cannot be provided because unreacted components remain after firing.

If the magnesium source used is $Mg(OH)_2$ powder and the silicon source used is $SiO_2$ powder in the method of the present invention for producing a forsterite powder, the mixed powder of the $Mg(OH)_2$ powder and the $SiO_2$ powder preferably has an average particle size of 1 μm or less. If the mixed powder of the $Mg(OH)_2$ powder and the $SiO_2$ powder has an average particle size of more than 1 μm, the mixed powder is difficult to fire at low temperature even if the copper particles are added.

Even if the $SiO_2$ powder has a particle size of 2.0 μm in the present invention, as described above, the particle size of the mixed powder can be controlled to 1 μm or less if the $Mg(OH)_2$ powder has a particle size of 0.20 to 0.40 μm and the molar ratio of $Mg(OH)_2$ to $SiO_2$, namely, $Mg(OH)_2/SiO_2$, falls within the range of 1.95 to 2.05.

In the present invention, a magnesium source such as $Mg(OH)_2$ or $MgCO_3$ may be used, although $MgCO_3$ readily forms a hydrate which tends to increase the hygroscopicity of the forsterite powder. The magnesium source used is preferably $Mg(OH)_2$ because it causes no such problem.

The silicon source used in the present invention is preferably $SiO_2$.

$SiO_2$ is available in various forms, including crystalline silica and amorphous silica. Of these, amorphous silica is preferred in the present invention because it has a higher reactivity with $Mg(OH)_2$ for the same particle size.

The forsterite powder is a polycrystalline forsterite powder in the method for producing a forsterite powder of the invention. The production method of the present invention can more reliably realize the advantages of the invention when used to produce a polycrystalline forsterite powder.

Mixing the magnesium source, the silicon source, and the copper particles in the presence of a solvent in the method for producing a forsterite powder in allows the mixed powder to be efficiently prepared with the magnesium source, the silicon source, and the copper particles homogeneously dispersed in the solvent. After the removal of the solvent, the mixed powder can be fired to produce a finer forsterite powder with stable characteristics. This makes the present invention more effective.

The forsterite powder contains 300 to 2,000 ppm by weight of copper. Within the range of about 300 to 2,000 ppm by weight, copper has no adverse effect on the characteristics of the forsterite itself. Hence, the method for producing a forsterite powder can be used to produce a fine forsterite powder that features low dielectric loss, that is economically advantageous, and that is suitable for production of electronic components.

If the forsterite powder has a structure in which copper is contained at crystal grain boundaries in an amount of 300 to 2,000 ppm by weight, the forsterite powder can achieve superior characteristics because MgO and $SiO_2$ react sufficiently even at low firing temperature and substantially no unreacted magnesium-based component remains.

The forsterite powder having the above structure can be efficiently produced by the method for producing a forsterite powder of the present invention.

If the forsterite powder has a particle size of 0.20 to 0.40 μm, the forsterite powder has low hygroscopicity and does not require a large amount of glass to be added because it has excellent sinterability, so that the characteristics such as the Q factor (the reciprocal of the dielectric loss δ) are not degraded.

The particle size thus preferably falls within the range of 0.20 to 0.40 μm. If the particle size falls below 0.20 μm, the forsterite powder has high hygroscopicity. If the particle size exceeds 0.40 μm, the forsterite powder, when used to produce a ceramic substrate, requires a large amount of glass to be added because it has poor sinterability. This is undesirable because the glass causes the problem of degrading of characteristics such as the Q factor.

When the forsterite powder has a crystal size of 0.034 to 0.040 µm, it provides excellent sinterability without having excessive hygroscopicity.

If the crystal size falls below 0.034 µm, the forsterite powder has a particle size of less than 0.2 µm. This is undesirable because such a forsterite powder has high hygroscopicity.

If the crystal size exceeds 0.040 µm, the forsterite powder has a particle size of more than 0.4 µm. Such a forsterite powder has poor sinterability. If the forsterite powder is used to produce, for example, a ceramic substrate, a large amount of glass must be added to improve the sinterability. This is undesirable because the glass causes the problem of degrading of characteristics such as the Q factor (the reciprocal of the dielectric loss δ).

The sintered forsterite of the present invention is produced by firing the forsterite powder described above. This sintered forsterite has desired characteristics and is economically advantageous.

As insulating ceramic composition of the present invention includes a first ceramic powder mainly including the above forsterite powder; a second ceramic powder formed of at least one material selected from the group consisting of a ceramic powder mainly containing calcium titanate, a ceramic powder mainly containing strontium titanate, and a ceramic powder mainly containing titanium oxide; and a borosilicate glass powder. The borosilicate glass contains 3% to 15% by weight of lithium on a $Li_2O$ basis, 30% to 50% by weight of magnesium on a MgO basis, 15% to 30% by weight of boron on a $B_2O_3$ basis, 10% to 35% by weight of silicon on a $SiO_2$ basis, 6% to 20% by weight of zinc on a ZnO basis, and 0% to 15% by weight of aluminum on an $Al_2O_3$ basis. This insulating ceramic composition is suitable for production of electronic components.

The content of the first ceramic powder in the insulating ceramic composition of the present invention is preferably 70% by weight or more. If the content of the first ceramic powder falls below 70% by weight, the Q factor (the reciprocal of the dielectric loss δ) of the composition after sintering is decreased.

In addition, the content of the second ceramic powder is preferably 3% to 30% by weight. If the content of the second ceramic powder falls below 3% by weight, it is difficult to suppress the temperature coefficient of dielectric constant, τ∈, of the composition after sintering to within ±100 ppm/° C. If the content of the second ceramic powder exceeds 30% by weight, it is difficult to suppress τ∈ to within ±100 ppm/° C., and the Q factor of the composition after sintering is also decreased.

In addition, the content of the borosilicate glass in the insulating ceramic composition of the present invention is preferably 3% to 20% by weight. If the content of the borosilicate glass falls below 3% by weight, the composition cannot be densely sintered because its porosity after sintering is increased as a result of insufficient sintering. If the content of the borosilicate glass exceeds 20% by weight, the Q factor of the composition after sintering is decreased.

A multilayer ceramic electronic component of Claim 12 of the present invention includes laminated insulating ceramic layers and the wiring conductors associated with the above insulating ceramic layers. The insulating ceramic layers are formed of the insulating ceramic composition, so that the multilayer ceramic electronic component is compact, has high performance, and is economically advantageous.

The insulating ceramic layers are formed of the insulating ceramic composition prepared using the forsterite powder of the present invention. In addition, the wiring conductors are formed using a metal with low resistivity, such as copper or silver, as a major component. The insulating ceramic layers have a low relative dielectric constant, superior temperature-dependent characteristics of resonant frequency, and a high Q factor, thus providing a highly reliable multilayer ceramic electronic component suitable for high-frequency applications.

Figure 1:
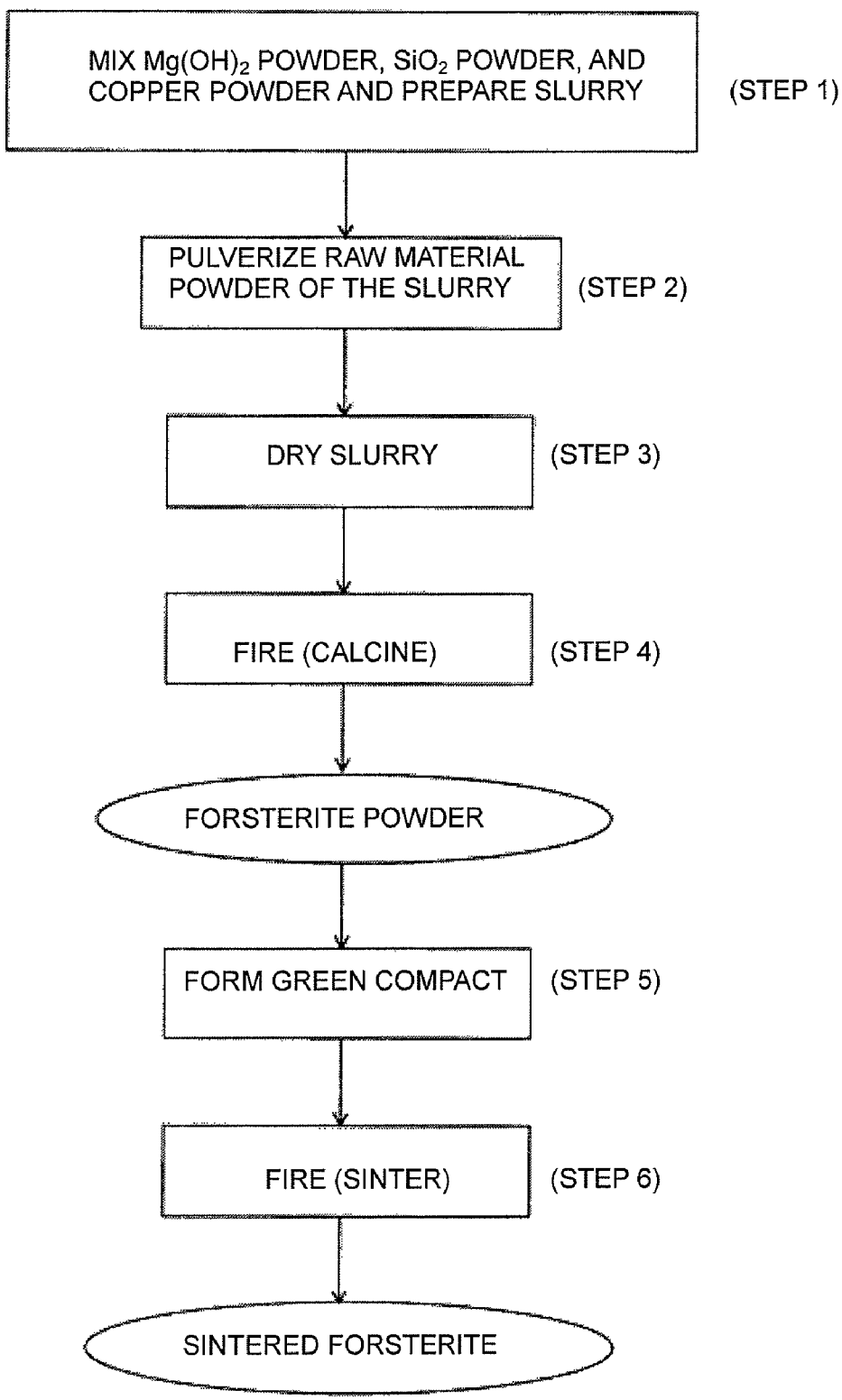
FIG. 1 is a flowchart of a method for producing a forsterite powder according to an example of the present invention.

| Reference Numerals | |
| --- | --- |
| 1: | ceramic multilayer module |
| 2: | multilayer ceramic substrate |
| 3: | insulating ceramic layer |
| 4: | high-dielectric-constant ceramic layer |
| 5: | copper |
| 6: | inner conductive film |
| 7: | via-hole conductor |
| 8: | outer conductive film |
| 9 to 17: | electronic component |
| 18: | conductive cap |
| 21: | LC filter |
| 22: | unfired laminate |
| 23: | component body |
| 24, 25, 26, and 27: | terminal electrode |
| 28 to 40: | ceramic green sheet |
| 41, 44, 58, and 60: | coil pattern |
| 42, 48, 49, 54, 55, and 61: | lead pattern |
| 43, 45, 46, 50, 52, 56, 57, and 59: | via-hole conductor |
| 47, 51, and 53: | capacitor pattern |
| 101: | water |

-continued

| Reference Numerals | |
| --- | --- |
| 102: | Mg(OH)$_2$ powder |
| 103: | SiO$_2$ powder |
| 104: | copper particle |
| B: | grain boundary |
| C: | capacitance |
| F: | forsterite powder |
| L1 and L2: | inductance |

BEST MODES FOR CARRYING OUT THE INVENTION

The features of the present invention will now be described in more detail with the examples of the invention below.

Example 1

Production of Forsterite Powder

In Example 1, forsterite powders were produced by the following procedure.

The method for producing the forsterite powders of Example 1 will now be described with reference to FIG. 1, which shows the production process.

(1) Mixing of Raw Materials and Preparation of Slurry

First, Mg(OH)$_2$ powder and SiO$_2$ powders were weighed out so that the molar ratio of MgO to SiO$_2$ (Mg(OH)$_2$/SiO$_2$) of the forsterite (2MgO.SiO$_2$) powders obtained after firing (calcination) was 1.97.

In addition, a copper sol (dispersing medium: water) was weighed out so that the contents of copper in the forsterite powders obtained after firing (calcination) were the values shown in Table 1.

The Mg(OH)$_2$ powder used in Example 1 had an average particle size of 2.5 μm, and the SiO$_2$ powder had an average particle size of 1.5 μm.

The copper sol had an average particle size of less than 0.05 μm. These raw materials were added to a dispersing medium, namely, pure water, and the dispersions were stirred with a stirrer for two to three hours to prepare slurries (Step 1 of FIG. 1). FIG. 2 is a schematic diagram showing the state of the slurries, in which Mg(OH)$_2$ particles 102, SiO$_2$ particles 103, and copper particles 104 were dispersed in water 101.

(2) Pulverization of Raw Materials

Figure 2:
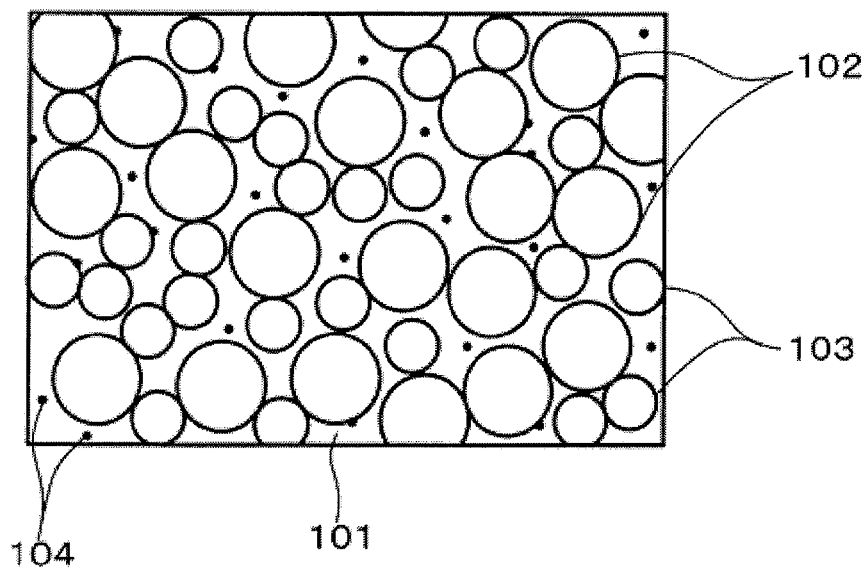
FIG. 2 is a schematic diagram showing the state of a slurry prepared by adding raw materials to a dispersing medium, namely, pure water, and stirring the mixture in a step of the method for producing forsterite according to the example of the present invention.

The raw materials in the slurries prepared in the above step were pulverized in a ball mill until the total average particle size of the raw materials was decreased to 0.3 μm and the average particle size of Mg(OH)$_2$ was decreased to 0.2 to 0.4 μm (Step 2 of FIG. 1).

(3) Drying

After the pulverization of the raw materials in the slurries in the above step, the slurries were dried at 150° C. (Step 3 of FIG. 1).

(4) Firing (Calcination)

Next, the dried powders obtained after the drying step were fired (calcined) in air at 1,100° C. for a retention time of two hours to prepare forsterite powders (Step 4 of FIG. 1), except that the firing temperature was 150° C. for Sample No. 7 (comparative example) of Table 1 and the retention time was five hours for Sample No. 8 (comparative example) of Table 1).

(5) Formation of Green Compact

The forsterite powders prepared by firing (calcination) were subjected to granulation and compaction molding to form green compacts (Step 5 of FIG. 1).

(6) Production of Sintered Forsterite Compact

The green compacts formed in the above step were sintered in air at 1,400° C. for two hours to prepare sintered forsterite compacts (Step 6 of FIG. 1).

Measurement of Characteristics (1) Particle Size

The forsterite powders prepared by firing (calcination) in the firing (calcining) step (4) were examined by scanning electron microscopy (SEM). The average particle size was determined by randomly extracting 100 particles, measuring their particle sizes through image analysis, and averaging the measurements. The results are shown in Table 1.

(2) Residual MgO

The forsterite powders prepared by firing (calcination) in the firing (calcining) step (4) were examined by XRD using an X-ray diffractometer (miniFlex, manufactured by Rigaku Corporation). The samples were evaluated as "Undetected" if no MgO peak was detected and as "Detected" if a MgO peak was detected. The results are shown in Table 1.

(3) Qf

The Qf of the sintered forsterite compacts prepared by sintering the green compacts in air at 1,400° C. for two hours in the step (6) of producing the sintered forsterite compacts was measured by a cavity resonator method at a measurement frequency of 18 to 22 GHz.

TABLE 1

| | | Calcination conditions | | Evaluation | | |
| --- | --- | --- | --- | --- | --- | --- |
| Sample No. | Copper content (wt. ppm) | Calcination temperature (° C.) | Calcination time (hr) | Average particle size (μm) | Residual MgO (wt. %) | Qf (GHz) |
| 1* | 200 | 1,100 | 2 | 0.30 | Detected | 140,000 |
| 2 | 300 | 1,100 | 2 | 0.33 | Undetected | 138,000 |
| 3 | 500 | 1,100 | 2 | 0.33 | Undetected | 135,000 |

TABLE 1-continued

| Sample No. | Calcination conditions | | | Evaluation | | |
|---|---|---|---|---|---|---|
| | Copper content (wt. ppm) | Calcination temperature (° C.) | Calcination time (hr) | Average particle size (μm) | Residual MgO (wt. %) | Qf (GHz) |
| 4 | 1,000 | 1,100 | 2 | 0.35 | Undetected | 128,000 |
| 5 | 2,000 | 1,100 | 2 | 0.38 | Undetected | 105,000 |
| 6* | 2,400 | 1,100 | 2 | 0.38 | Undetected | 96,000 |
| 7* | 200 | 1,150 | 2 | 0.55 | Undetected | 140,000 |
| 8* | 200 | 1,100 | 5 | 0.53 | Undetected | 141,000 |

Evaluation of Characteristics

In Table 1, Sample Nos. 1, 6, 7, and 8, marked with asterisks, were samples (comparative examples) outside the scope of the present invention. The other samples, namely, Sample Nos. 2, 3, 4, and 5, were samples according to the example of the present invention which satisfied the requirements of the invention.

The results shown in Table 1 demonstrate that a forsterite powder which has small particle size, which contains no unreacted MgO, and which has a high Qf can be produced under the firing conditions of a low firing (calcination) temperature, namely, 1,100° C., and a short retention time, namely, two hours, if the amount of copper added is selected so that the forsterite powder obtained after the firing contains 300 to 2,000 ppm by weight of copper, as in the case of Sample Nos. 2, 3, 4, and 5.

The results also demonstrate that unreacted MgO remains in forsterite if the amount of copper added falls below 300 ppm by weight, as in the case of Sample No. 1 of Table 1.

The results also demonstrate that no MgO remains after firing (calcination) at an elevated temperature, namely, 1,150° C., as in the case of Sample No. 7, or for an extended period of time, namely, five hours, as in the case of Sample No. 8, although the forsterite powder was coarsened to an average particle size of more than 0.5 μm after the extended grain growth.

The results also demonstrate that the Qf falls below 100,000 GHz if the amount of copper added exceeds 2,000 ppm by weight, as in the case of Sample No. 6, meaning that the forsterite powder loses one of its features, namely, low dielectric loss.

Figure 3:
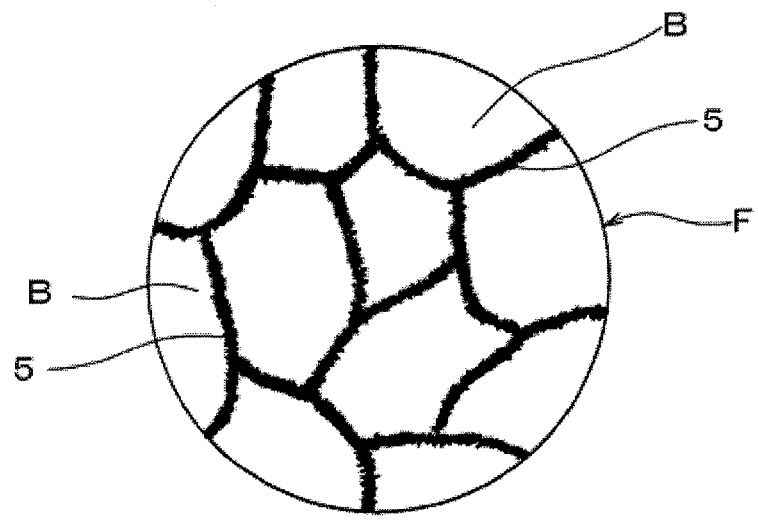
FIG. 3 is a schematic diagram of a particle of a forsterite powder produced by the production method according to the example of the present invention.

FIG. 3 is a schematic diagram of a particle of a forsterite powder produced by the production method of Example 1. In FIG. 3, a forsterite powder F prepared by firing (calcination) in the firing (calcining) step (4) contains copper 5 at grain boundaries B. If the amount of copper 5 contained at the grain boundaries B is 300 to 2,000 ppm by weight, a forsterite powder which has small particle size, which contains no unreacted MgO, and which has low dielectric loss can be produced at a relatively low firing temperature.

Example 2

Figure 4:
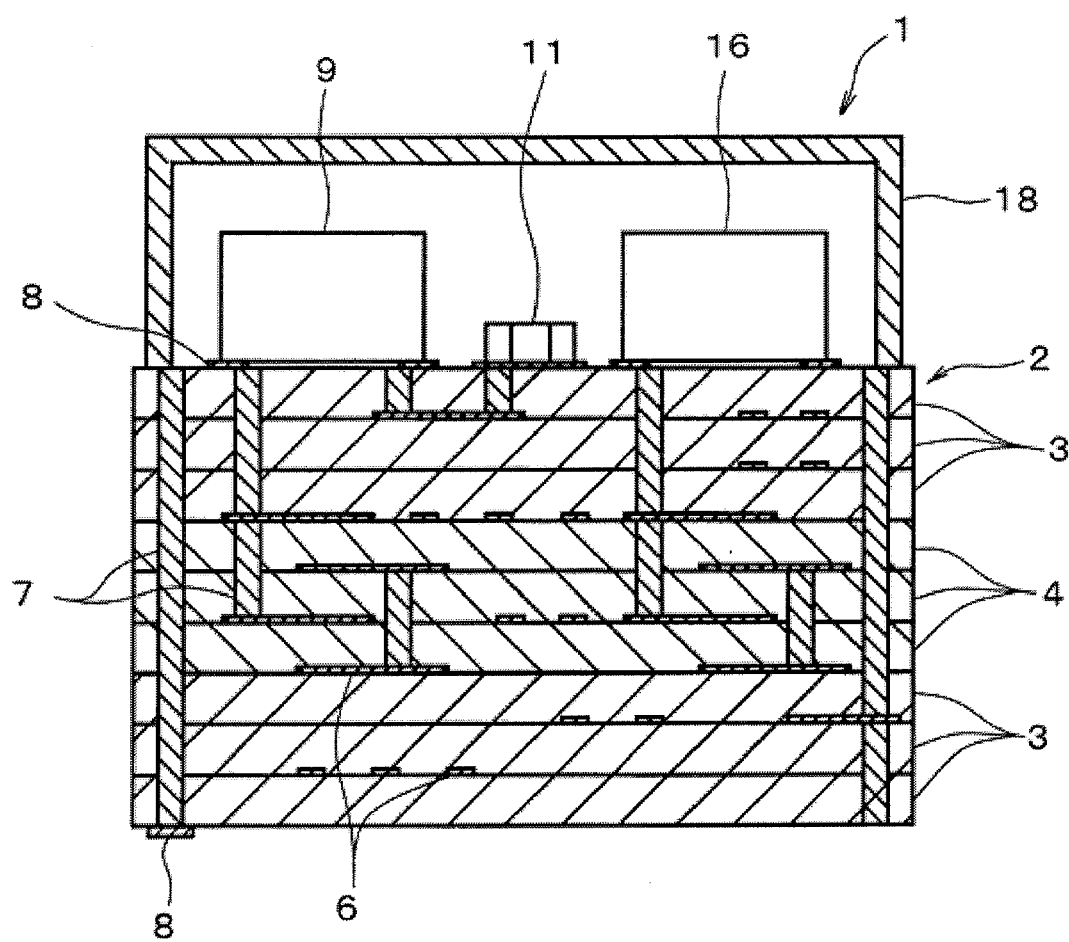
FIG. 4 is a sectional view of a ceramic multilayer module as an example of a multilayer ceramic electronic component produced using an insulating ceramic composition prepared using a forsterite powder according to the present invention.
Figure 5:
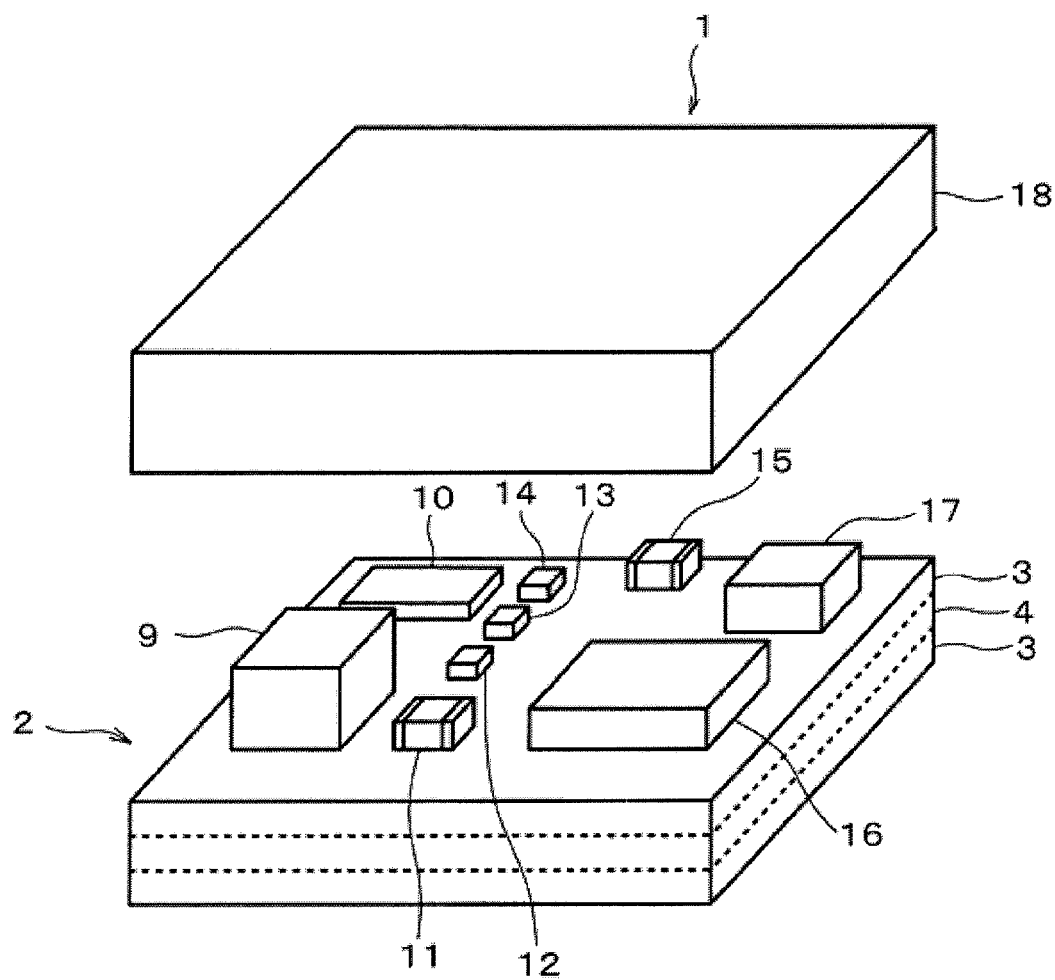
FIG. 5 is an exploded perspective view of the ceramic multilayer module of FIG. 4.

FIG. 4 is a sectional view of a ceramic multilayer module 1 as an example of a multilayer ceramic electronic component produced using an insulating ceramic composition containing a forsterite powder according to the present invention. FIG. 5 is an exploded perspective view of the ceramic multilayer module 1 shown in FIG. 4.

The ceramic multilayer module 1 includes a multilayer ceramic substrate 2. The multilayer ceramic substrate 2 includes a laminate of insulating ceramic layers 3 and high-dielectric-constant ceramic layers 4. The high-dielectric-constant ceramic layers 4 are between the insulating ceramic layers 3.

The insulating ceramic layers 3 are formed of insulating sintered ceramic compacts produced by firing an insulating ceramic composition according to the present invention. The insulating ceramic layers 3 have a relatively low relative dielectric constant of, for example, 10 or less.

Specifically, the insulating ceramic composition used for the insulating ceramic layers 3 in Example 2 is prepared by mixing (a) a first ceramic powder mainly including a forsterite powder as described in Example 1; (b) a second ceramic powder formed of at least one material selected from the group consisting of a ceramic powder mainly containing calcium titanate, a ceramic powder mainly containing strontium titanate, and a ceramic powder mainly containing titanium oxide; and (c) a borosilicate glass powder containing 3% to 15% by weight of lithium on a $Li_2O$ basis, 30% to 50% by weight of magnesium on a MgO basis, 15% to 30% by weight of boron on a $B_2O_3$ basis, 10% to 35% by weight of silicon on a $SiO_2$ basis, 6% to 20% by weight of zinc on a ZnO basis, and 0% to 15% by weight of aluminum on an $Al_2O_3$ basis.

The high-dielectric-constant ceramic layers 4 are formed of, for example, a material prepared by adding glass to barium titanate, and have a relative dielectric constant of 15 or more, preferably 30 or more.

The multilayer ceramic substrate 2 further includes various wiring conductors. Specifically, the wiring conductors are typified by inner conductive films 6 formed along some of the interfaces between the insulating ceramic layers 3 and the high-dielectric-constant ceramic layers 4, via-hole conductors 7 extending through some of the insulating ceramic layers 3 and the high-dielectric-constant ceramic layers 4, and outer conductive films 8 formed on the outer surfaces of the multilayer ceramic substrate 2.

Some of the inner conductive films 6 associated with the high-dielectric-constant ceramic layers 4 are arranged so as to provide capacitance, thus constituting capacitors.

Electronic components 9 to 17 are mounted on the top surface of the multilayer ceramic substrate 2. Of the electronic components 9 to 17 shown in the figure, for example, the electronic component 9 is a diode, the electronic component 11 is a monolithic ceramic capacitor, and the electronic component 16 is a semiconductor IC. These electronic components 9 to 17 are electrically connected to some of the outer conductive films 8 on the top surface of the multilayer ceramic substrate 2. The electronic component 9 to 17 and the wiring conductors formed inside the multilayer ceramic substrate 2 constitute circuitry required for the ceramic multilayer module 1.

A conductive cap 18 for shielding the electronic components 9 to 17 is provided on the top surface of the multilayer ceramic substrate 2 and is electrically connected to some of the via-hole conductors 7.

In addition, the ceramic multilayer module 1 is configured so that it can be mounted on a mother board (not shown) using some of the outer conductive films 8 on the bottom surface of the multilayer ceramic substrate 2 as connection terminals.

The ceramic multilayer module 1 of Example 2 can be produced by a known technique for producing multilayer ceramic electronic components. A method for producing the ceramic multilayer module 1 of Example 2 will now be described.

First, ceramic green sheets for the insulating ceramic layers 3 are formed. Specifically, an organic vehicle containing a binder resin and a solvent is added to the insulating ceramic composition according to the present invention (i.e., raw material composition) to prepare a ceramic slurry. The ceramic slurry is formed into sheets using a doctor blade, and the sheets are dried and cut to a predetermined size to form ceramic green sheets. The wiring conductors are then formed on the ceramic green sheets by applying a conductive paste mainly containing copper or silver in a desired pattern.

In addition, ceramic green sheets are formed using a high-dielectric-constant ceramic composition prepared as the high-dielectric-constant material of the high-dielectric-constant ceramic layers 4. Specifically, any of the following high-dielectric-constant ceramic compositions (1) to (4), for example, is prepared.

Figure 6:
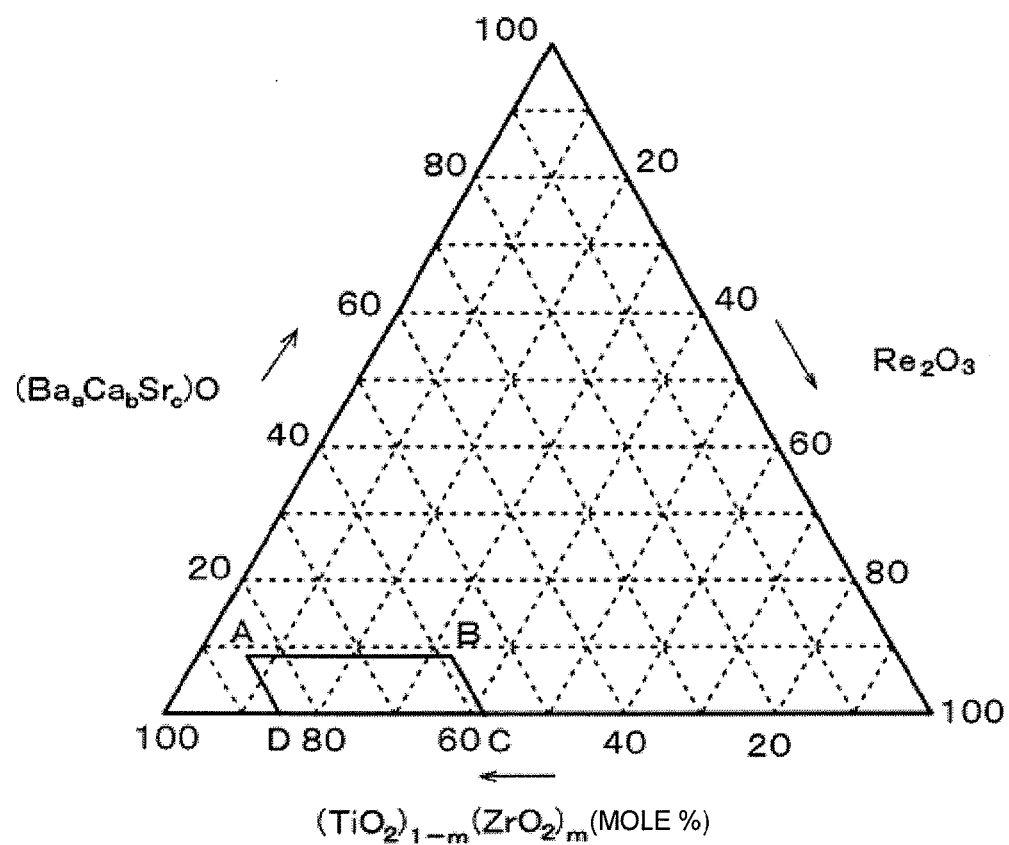
FIG. 6 is a ternary phase diagram of the composition of the high-dielectric-constant material of high-dielectric-constant ceramic layers for the ceramic multilayer module of FIG. 4.

(1) A high-dielectric-constant ceramic composition, as described in Japanese Unexamined Patent Application Publication No. 2001-80959, including 100 parts by weight of a major component represented by the formula $x(Ba_aCa_bSr_c)O-y[(TiO_2)_{1-m}(ZrO_2)_m]-zRe_2O_3$ (where x, y, and z are expressed in mole percent; $x+y+z=100$; $a+b+c=1$; $0 \leq b+c < 0.8$; $0 \leq m < 0.15$; Re is at least one rare-earth element; and the $(Ba_aCa_bSr_c)O-[(TiO_2)_{1-m}(ZrO_2)_m]-Re_2O_3$ molar ratio (x,y,z) lies within the region surrounded by Point A (7,85,8), Point B (7,59,34), Point C (0,59,41), and Point D (0,85,15) (excluding the line between Points A and B) in the ternary phase diagram of FIG. 6 of the attached drawings) and also including 0.1 to 25 parts by weight of a first minor component containing a $SiO_2$-based glass and 0.5 to 20 parts by weight of a second minor component containing manganese on a manganese basis.

(2) A high-dielectric-constant ceramic composition, as described in Japanese Unexamined Patent Application Publication No. 2002-97072, including a $BaO-TiO_2-ReO_{3/2}$-based ceramic composition represented by the formula $xBaO-yTiO_2-zReO_{3/2}$ (where x, y, and z are expressed in mole percent; $x+y+z=100$; $8 \leq x \leq 18$; $52.5 \leq y \leq 65$; $20 \leq z \leq 40$; and Re is at least one rare-earth element) and a glass composition containing 10% to 25% by weight of $SiO_2$, 10% to 40% by weight of $B_2O_3$, 25% to 55% by weight of MgO, 0% to 20% by weight of ZnO, 0% to 15% by weight of $Al_2O_3$, 0.5% to 10% by weight of $Li_2O$, and 0% to 10% by weight of RO (where R is at least one of barium, strontium, and calcium).

(3) A high-dielectric-constant ceramic composition, as described in Japanese Unexamined Patent Application Publication No. 11-310455, including a mixture of a $BaO-TiO_2-ReO_{3/2}-BiO_3$-based ceramic powder (where Re is a rare-earth element) and a glass powder containing 13% to 50% by weight of $SiO_2$, 3% to 30% by weight of $B_2O_3$, 40% to 80% by weight of an alkaline earth metal oxide, and 0.1% to 10% by weight of $Li_2O$.

(4) A high-dielectric-constant ceramic composition, as described in Japanese Unexamined Patent Application Publication No. 11-228222, including a mixture of a $BaO-TiO_2-ReO_{3/2}$-based ceramic powder (where Re is a rare-earth element) and a glass powder containing 13% to 50% by weight of $SiO_2$, 3% to 30% by weight of $B_2O_3$, 40% to 80% by weight of an alkaline earth metal oxide, and 0.5% to 10% by weight of $Li_2O$.

The high-dielectric-constant ceramic composition (1) preferably further contains $Li_2O$.

Next, an organic vehicle containing a binder resin and a solvent is added to any of the insulating ceramic compositions (1) to (4) to prepare a ceramic slurry. The ceramic slurry is formed into sheets using a doctor blade, and the sheets are dried and cut to a predetermined size to form ceramic green sheets. The wiring conductors are then formed on the ceramic green sheets by applying a conductive paste mainly containing copper or silver in a desired pattern.

Predetermined numbers of the insulating ceramic green sheets and the high-dielectric-constant ceramic green sheets are laminated in a predetermined order before the laminate is pressed in the thickness direction.

The unsintered laminate thus formed is fired at 1,000° C. or less, for example, at 800° C. to 1,000° C., to produce the multilayer ceramic substrate 2. The firing is performed in a nonoxidizing atmosphere, such as a nitrogen atmosphere, if the wiring conductors mainly contain copper and in an oxidizing atmosphere, such as air, if the wiring conductors mainly contain silver.

Subsequently, the electronic components 9 to 17 are mounted on a surface of the multilayer ceramic substrate 2 by soldering, for example, and the conductive cap 18 is attached thereto. Thus, the ceramic multilayer module 1 shown in FIG. 4 is finished.

In the ceramic multilayer module 1 thus produced, the insulating ceramic layers 3, constituting part of the multilayer ceramic substrate 2, are formed of the insulating ceramic composition according to the present invention. In addition, the mixed conductors (the inner conductive films 6, the via-hole conductors 7, and the outer conductive films 8) are formed using a metal with low resistivity, such as copper or silver, as a major component. The insulating ceramic layers 3 have a low relative dielectric constant, superior temperature-dependent characteristics of resonant frequency, and a high Q factor, so that the ceramic multilayer module 1 is highly reliable and is suitable for high-frequency applications.

Example 3

Figure 7:
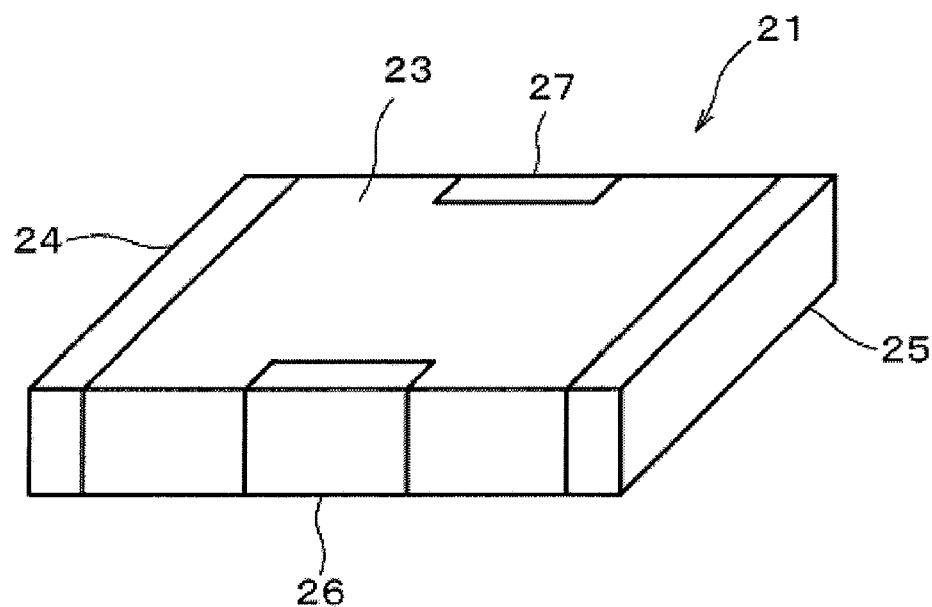
FIG. 7 is a perspective view showing the appearance of an LC filter as a multilayer ceramic electronic component produced using an insulating ceramic composition of the present invention.
Figure 8:
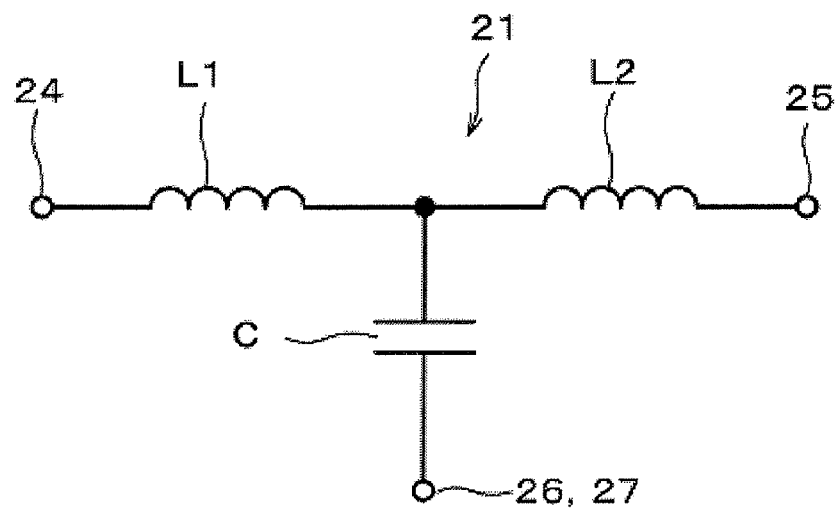
FIG. 8 is an equivalent circuit diagram of the LC filter of FIG. 7.
Figure 9:
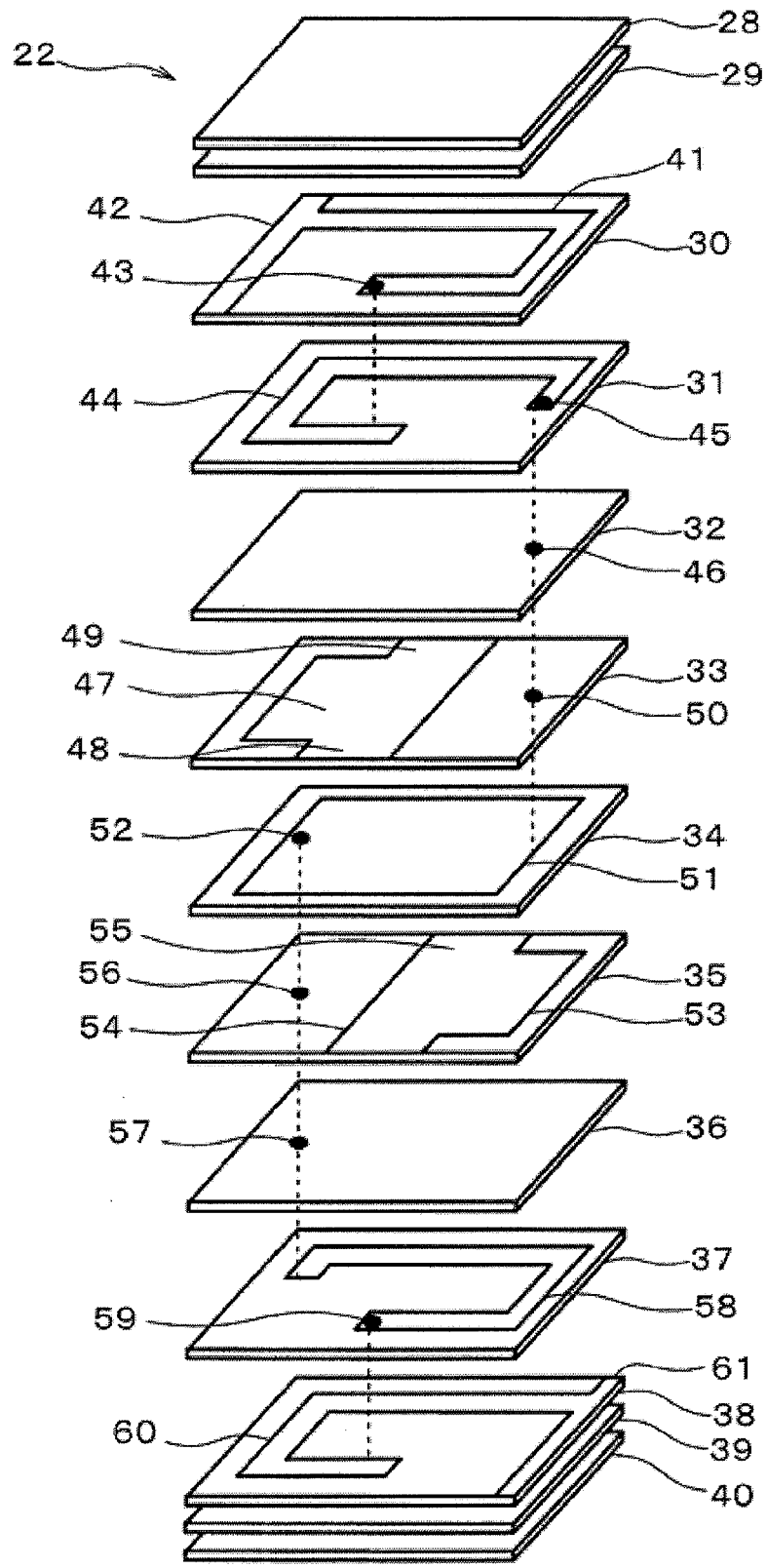
FIG. 9 is an exploded perspective view of an unfired laminate as an intermediate product to be subjected to a firing step in the production of the LC filter of FIG. 7.

FIGS. 7 and 8 are diagrams of an LC filter 21 as another example (Example 3) of a multilayer ceramic electronic component produced using an insulating ceramic composition containing a forsterite powder according to the present invention. FIG. 7 is a perspective view showing the appearance of the LC filter 21. FIG. 8 is an equivalent circuit diagram of the LC filter 21. FIG. 9 is an exploded perspective view of an unfired laminate 22 as an intermediate product to be subjected to a firing step in the production of the LC filter.

In FIG. 7, the LC filter 21 of Example 3 includes a component body 23 having a multilayer structure of insulating ceramic layers, terminal electrodes 24 and 25 disposed on opposing ends of the component body 23, and terminal electrodes 26 and 27 disposed midway along the sides of the component body 23.

In FIG. 8, the LC filter 21 includes two inductances L1 and L2 directly connected between the terminal electrodes 24 and 25 and a capacitance C provided between a node of the inductances L1 and L2 and the terminal electrodes 26 and 27.

In FIG. 9, the unfired laminate 22, which is to constitute the component body 23 after firing, includes laminated ceramic green sheets 28 to 40. The number of ceramic green sheets laminated is not limited to that shown in FIG. 9.

The ceramic green sheets 28 to 40 are formed by mixing an insulating ceramic composition containing a forsterite powder according to the present invention with an organic vehicle containing a binder resin and a solvent to prepare a ceramic slurry, forming the ceramic slurry into sheets using a doctor blade, drying the sheets, and cutting the sheets to a predetermined size.

To provide the inductances L1 and L2 and the capacitance C shown in FIG. 8, wiring conductors are provided on some of the ceramic green sheets 28 to 40 in the following manner.

The ceramic green sheet 30 has a coil pattern 41 constituting one end of the inductance L1, a lead pattern 42 extending from one end of the coil pattern 41, and a via-hole conductor 43 disposed at the other end of the coil pattern 41.

The ceramic green sheet 31 has a coil pattern 44 constituting part of the inductance L1 and a via-hole conductor 45 disposed at one end of the coil pattern 44. The other end of the coil pattern 44 is connected to the via-hole conductor 43.

The ceramic green sheet 32 has a via-hole conductor 46 connected to the via-hole conductor 45.

The ceramic green sheet 33 has a capacitor pattern 47 constituting part of the capacitance C, lead patterns 48 and 49 extending from the capacitor pattern 47, and a via-hole conductor 50 connected to the via-hole conductor 46.

The ceramic green sheet 34 has a capacitor pattern 51 constituting part of the capacitance C and a via-hole conductor 52 connected to the capacitor pattern 51. The capacitor pattern 51 is also connected to the via-hole conductor 50.

The ceramic green sheet 35 has a capacitor pattern 53 constituting part of the capacitance C, lead patterns 54 and 55 extending from the capacitor pattern 53, and a via-hole conductor 56 connected to the via-hole conductor 52.

The ceramic green sheet 36 has a via-hole conductor 57 connected to the via-hole conductor 56.

The ceramic green sheet 37 has a coil pattern 58 constituting part of the inductance L2 and a via-hole conductor 59 disposed at one end of the coil pattern 58. The other end of the coil pattern 58 is connected to the via-hole conductor 57.

The ceramic green sheet 38 has a coil pattern 60 constituting part of the inductance L2 and a lead pattern 61 extending from one end of the coil pattern 60. The other end of the coil pattern 60 is connected to the via-hole conductor 59.

The coil patterns 41, 44, 58, and 60, the lead patterns 42, 48, 49, 54, 55, and 61, the via-hole conductors 43, 45, 46, 50, 52, 56, 57, and 59, and the capacitor patterns 47, 51, and 53 are formed using a conductive paste mainly containing copper or silver. The conductive paste is applied by a method such as screen printing.

The ceramic green sheets 28 to 40 are laminated in the order shown in FIG. 9 and are pressed in the thickness direction to form the unfired laminate 22.

Subsequently, the unfired laminate 22 is fired at 1,000° C. or less, for example, at 800° C. to 1,000° C., to produce the component body 23 shown in FIG. 7.

As in the case of the ceramic multilayer module 1, the firing is performed in a nonoxidizing atmosphere, such as a nitrogen atmosphere, if the wiring conductors mainly contain copper and in an oxidizing atmosphere, such as air, if the wiring conductors mainly contain silver.

Subsequently, the terminal electrodes 24 to 27 are formed on the outer surfaces of the component body 23. The terminal electrodes 24 to 27 are formed by a thin-film formation method, such as coating and firing, vapor deposition, plating, or sputtering, using a conductive paste mainly containing copper or silver.

The LC filter 21 can thus be produced.

In Example 3, the ceramic green sheets 28 to 40 are formed using an insulating ceramic composition according to the present invention. Of the ceramic green sheets 28 to 40, those that are directly associated with the formation of the capacitance C, namely, the ceramic green sheets 33 and 34, are preferably formed using the high-dielectric-constant ceramic composition used as the high-dielectric-constant material of the high-dielectric-constant ceramic layers 4 for the ceramic multilayer module 1 shown in FIG. 4.

The types of multilayer ceramic electronic components to which the insulating ceramic composition according to the present invention can be applied are not limited to the ceramic multilayer module 1 and the LC filter 21 shown in the drawings. The insulating ceramic composition according to the present invention can be applied to, for example, various multilayer ceramic substrates such as multilayer ceramic substrates for multichip modules and multilayer ceramic substrates for hybrid ICs, various composite electronic components produced by mounting electronic components on such multilayer ceramic substrates, and various chip multilayer electronic components such as chip multilayer capacitors and chip multilayer dielectric antennas.

The present invention is also not limited to the above examples in other respects; various applications and modifications are permitted within the scope of the present invention in terms of, for example, the proportions of the components of the forsterite powder, specific conditions for synthesis of forsterite, the proportions of the components of the insulating ceramic composition, and specific structures for multilayer ceramic electronic components.

INDUSTRIAL APPLICABILITY

As described above, the method for producing a forsterite powder according to the present invention allows economical production of a forsterite powder with superior characteristics which has small particle size and which contains substantially no unreacted magnesium-based component at a relatively low firing temperature by firing a magnesium source, such as $Mg(OH)_2$ powder, and a silicon source, such as $SiO_2$ powder, in the presence of copper particles.

Accordingly, the present invention has a wide range of applications in various fields, including the production technology of forsterite powder, the field of sintered forsterite and insulating ceramic compositions containing forsterite powder, and the field of multilayer ceramic electronic components produced using insulating ceramic compositions containing forsterite powder.

The invention claimed is:

1. A forsterite powder containing 300 to 2,000 ppm by weight of copper.

2. The forsterite powder according to claim 1, wherein the copper is at crystal grain boundaries.

3. The forsterite powder according to claim 2, wherein the forsterite powder has a particle size of 0.20 to 0.40 μm.

4. The forsterite powder according to claim 3, wherein the forsterite powder has a crystal size of 0.034 to 0.040 μm.

5. The forsterite powder according to claim 1, wherein the copper is at crystal grain boundaries.

6. The forsterite powder according to claim 1, wherein the forsterite powder has a particle size of 0.20 to 0.40 μm.

7. The forsterite powder according to claim 1, wherein the forsterite powder has a crystal size of 0.034 to 0.040 μm.

8. A sintered forsterite of claim 1.

9. An insulating ceramic composition comprising:
a first ceramic powder mainly comprising the forsterite powder according to claim 1;
a second ceramic powder formed of at least one material selected from the group consisting of a ceramic powder mainly containing calcium titanate, a ceramic powder mainly containing strontium titanate, and a ceramic powder mainly containing titanium oxide; and
a borosilicate glass powder;
wherein the borosilicate glass contains 3% to 15% by weight of lithium on a $Li_2O$ basis, 30% to 50% by weight of magnesium on a MgO basis, 15% to 30% by weight of boron on a $B_2O_3$ basis, 10% to 35% by weight of silicon on a $SiO_2$ basis, 6% to 20% by weight of zinc on a ZnO basis, and 0% to 15% by weight of aluminum on an $Al_2O_3$ basis.

10. An insulating ceramic composition according to claim 9, wherein the first ceramic powder, the second ceramic powder is 3 to 30 weight percent thereof, and the glass is 3 to 30 weight percent thereof.

11. A multilayer ceramic electronic component comprising laminated insulating ceramic layers and wiring conductors associated with the insulating ceramic layers, wherein
the insulating ceramic layers comprise the insulating ceramic composition according to claim 10; and
the wiring conductors mainly comprise copper or silver.

12. A multilayer ceramic electronic component comprising laminated insulating ceramic layers and wiring conductors associated with the insulating ceramic layers, wherein
the insulating ceramic layers comprise the insulating ceramic composition according to claim 9; and
the wiring conductors mainly comprise copper or silver.

* * * * *